US007240310B2

(12) United States Patent
Cook et al.

(10) Patent No.: US 7,240,310 B2
(45) Date of Patent: Jul. 3, 2007

(54) METHOD, SYSTEM AND PROGRAM PRODUCT FOR EVALUATING A CIRCUIT

(75) Inventors: Michelle K. Cook, Georgetown, TX (US); Bruce R. Archambeault, Four Oaks, NC (US); Charles R. Gates, Poughkeepsie, NY (US); Derrick D. Scott, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 10/904,950

(22) Filed: Dec. 7, 2004

(65) Prior Publication Data

US 2006/0123364 A1 Jun. 8, 2006

(51) Int. Cl.
*G06F 17/50* (2006.01)

(52) U.S. Cl. ............................................. 716/5; 703/13

(58) Field of Classification Search .................... 716/4, 716/2, 18; 703/15
See application file for complete search history.

(56) References Cited

U.S. PATENT DOCUMENTS

| 4,488,354 | A | 12/1984 | Chan et al. |
| 4,791,586 | A | 12/1988 | Maeda et al. |
| 5,051,938 | A | 9/1991 | Hyduke |
| 5,062,054 | A | 10/1991 | Kawakami et al. |
| 5,625,578 | A | 4/1997 | Du Cloux et al. |
| 5,774,367 | A * | 6/1998 | Reyes et al. ................... 716/2 |
| 5,883,808 | A * | 3/1999 | Kawarabayashi ............... 716/2 |
| 6,212,490 | B1 | 4/2001 | Li et al. |
| 6,230,115 | B1 | 5/2001 | Ohsaki et al. |
| 6,321,186 | B1 * | 11/2001 | Yuan et al. ..................... 703/15 |
| 6,405,349 | B1 * | 6/2002 | Gehman et al. ................ 716/4 |
| 6,564,355 | B1 | 5/2003 | Smith et al. |
| 6,629,305 | B2 | 9/2003 | Ito et al. |
| 6,687,893 | B2 | 2/2004 | Teig et al. |
| 6,834,380 | B2 * | 12/2004 | Khazei ......................... 716/10 |
| 6,938,231 | B2 * | 8/2005 | Yoshida et al. ................. 716/5 |
| 2001/0052107 | A1 * | 12/2001 | Anderson et al. ............... 716/4 |
| 2002/0046391 | A1 * | 4/2002 | Ito et al. ....................... 716/18 |
| 2002/0156607 | A1 | 10/2002 | Tosaka et al. |
| 2004/0117746 | A1 * | 6/2004 | Narain et al. ................... 716/4 |

OTHER PUBLICATIONS

Duncan, S. A. et al., "Automated Physical Design Utility for Reworking Circuit Panels," IBM Technical Disclosure Bulletin, vol. 36, No. 05, May 1993, pp. 257.

\* cited by examiner

*Primary Examiner*—Leigh M. Garbowski
(74) *Attorney, Agent, or Firm*—Joseph Petrokaitis; Hoffman, Warnick & D'Alessandro LLC

(57) ABSTRACT

An improved solution for designing and/or evaluating a circuit is provided. A rule violation can be detected in design data for the circuit and a prediction can be generated based on an adjustment to the design data. For example, multiple predictions can be generated based on an adjustment window for an adjustable parameter in the design data. The predictions can be displayed to a user, who can determine a desired modification to the design data. The modification can be implemented by the user and/or automatically implemented by a circuit design tool.

30 Claims, 4 Drawing Sheets

METHOD, SYSTEM AND PROGRAM PRODUCT FOR EVALUATING A CIRCUIT

BACKGROUND OF THE INVENTION

1. Technical Field

The invention relates generally to circuit design, and more particularly, to a solution that detects a rule violation in a circuit and generates a set of predictions based on one or more adjustments.

2. Background Art

Printed circuit boards used in computing devices typically must pass one or more electromagnetic compliance tests before being sold in a country. The use of good design practices in designing each printed circuit board is one of the most cost-effective solutions for increasing the probability that a manufactured circuit board will subsequently pass the test(s). To this extent, it is preferred to check design data for a new printed circuit board against these good design practices to determine any violations. Subsequently, the circuit board design can be altered, if possible, to conform to these design practices before the circuit board is manufactured.

Currently, most checking of design data for circuits is conducted manually. In particular, an individual may visually review the design data using circuit design software to identify any violations. Due to the complexity of this task, some software tools exist to check the design data against a previously-specified set of physical design parameters to detect a violation. Even so, once a violation is identified, the individual must assess the relative benefit of modifying the design data to conform to the design parameter versus the relative risk of not modifying the design data. To assist in this assessment, the individual can use full-wave simulation software. In a full-wave simulation, a model representative of a particular problem is generated and a simulator processes the model to yield a result. However, due to the complexity of even a simple problem, actual processing time of the full-wave simulation can be long (perhaps 24 hours). As a result, full-wave simulation is limited to evaluating specific simple problems, making some circuit designs too large to be simulated.

In light of this situation, a need exists for an improved solution for designing and/or evaluating a circuit. In particular, a need exists for a solution by which a rule violation can be identified in the circuit and one or more predictions as to the anticipated benefit of modifying the circuit to remove/partially remove the rule violation can be efficiently generated.

SUMMARY OF THE INVENTION

The invention provides an improved solution for designing and/or evaluating a circuit (e.g., printed circuit board layout, integrated circuit layout, or the like). In particular, design data for the circuit can be evaluated by detecting one or more rule violations, and generating one or more predictions based on adjustment(s) to the design data. In one embodiment, an adjustment window can be used to generate a plurality of adjustments. Subsequently, for each adjustment, a corresponding predicted impact can be determined. Each predicted impact can be calculated using a calculation algorithm that approximates an anticipated behavior of the circuit. In this manner, a user can view various options for modifying the circuit and make an informed decision as to which modification is most desirable. Further, the evaluation can be included as part of a circuit design tool. In this case, one or more modifications to the design data can be selected and provided to the user for implementation and/or automatically implemented by the circuit design tool. As a result, the invention provides an improved solution for efficiently developing and/or evaluating a circuit.

A first aspect of the invention provides a method of evaluating a circuit, the method comprising: obtaining design data for the circuit; detecting a rule violation based on the design data; obtaining an adjustment window for an adjustable parameter for the rule violation; and generating a plurality of predictions based on the adjustment window.

A second aspect of the invention provides a system for evaluating a circuit, the system comprising: a modification system for obtaining design data for the circuit; a violation system for detecting a rule violation based on the design data; an adjustment system for obtaining an adjustment window for an adjustable parameter for the rule violation; and a prediction system for generating a plurality of predictions based on the adjustment window.

A third aspect of the invention provides a program product stored on a computer-readable medium, which when executed, evaluates a circuit, the program product comprising: program code for obtaining design data for the circuit; program code for detecting a rule violation based on the design data; program code for obtaining an adjustment window for an adjustable parameter for the rule violation; and program code for generating a plurality of predictions based on the adjustment window.

A fourth aspect of the invention provides a circuit design tool comprising: a modification system for managing design data for the circuit; a violation system for detecting a rule violation based on the design data; a parameter system for obtaining an adjustment window for an adjustable parameter for the rule violation; and a predication system for generating a plurality of predictions based on the adjustment window.

A fifth aspect of the invention provides a method of designing a circuit, the method comprising: obtaining design data for the circuit; detecting a rule violation based on a rule and the design data; obtaining an adjustment for an adjustable parameter for the rule violation; applying a calculation algorithm to the rule violation and the adjustment to generate a prediction; and automatically implementing the adjustment into the design data.

A sixth aspect of the invention provides a circuit design tool comprising: a modification system for managing design data for the circuit; a violation system for detecting a rule violation based on a rule and the design data; a parameter system for obtaining an adjustment for an adjustable parameter for the rule violation; and a prediction system for applying a calculation algorithm to the rule violation and the adjustment to generate a prediction.

A seventh aspect of the invention provides a method of deploying an application for evaluating a circuit, the method comprising: providing a computer infrastructure being operable to: obtain design data for the circuit; detect a rule violation based on the design data; obtain an adjustment window for an adjustable parameter for the rule violation; and generate a plurality of predictions based on the adjustment window.

A eighth aspect of the invention provides computer software embodied in a propagated signal for evaluating a circuit, the computer software comprising instructions to cause a computer system to perform the following functions: obtain design data for the circuit; detect a rule violation based on the design data; obtain an adjustment window for an adjustable parameter for the rule violation; and generate a plurality of predictions based on the adjustment window.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

As indicated above, the invention provides an improved solution for designing and/or evaluating a circuit (e.g., printed circuit board layout, integrated circuit layout, or the like). In particular, design data for the circuit can be evaluated by detecting one or more rule violations, and generating one or more predictions based on adjustment(s) to the design data. In one embodiment, an adjustment window can be used to generate a plurality of adjustments. Subsequently, for each adjustment, a corresponding predicted impact can be determined. Each predicted impact can be calculated using a calculation algorithm that approximates an anticipated behavior of the circuit. In this manner, a user can view various options for modifying the circuit and make an informed decision as to which modification is most desirable. Further, the evaluation can be included as part of a circuit design tool. In this case, one or more modifications to the design data can be selected and provided to the user for implementation and/or automatically implemented by the circuit design tool. As a result, the invention provides an improved solution for efficiently developing and/or evaluating a circuit.

Figure 1:
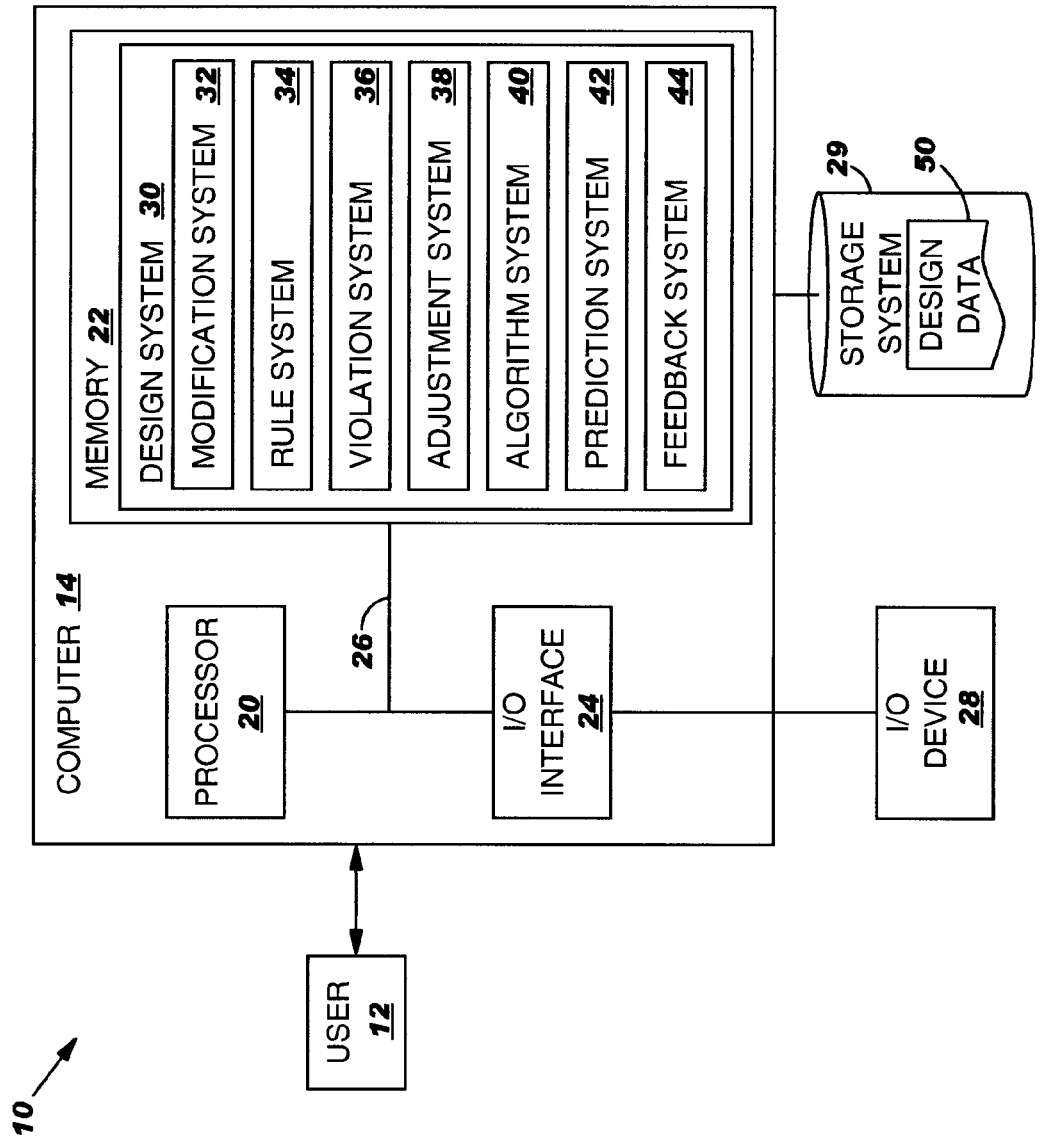
FIG. 1 shows an illustrative system for designing and/or evaluating a circuit according to one embodiment of the invention.

Turning to the drawings, FIG. 1 shows an illustrative system 10 for designing and/or evaluating a circuit. In particular, a design system 30 manages design data 50 for the circuit. To this extent, user 12 can use design system 30 to perform various manipulations (e.g., additions, modifications, deletions, etc.) on design data 50. Additionally, user 12 can request that design system 30 evaluate the circuit by detecting one or more rule violations in design data 50, and generate one or more predictions based on various possible adjustments to the design data 50. Subsequently, user 12 and/or design system 30 can implement one or more modifications into design data 50 based on the prediction(s).

Design system 30 is shown implemented on computer 14 as computer program code. To this extent, computer 14 is shown including a processor 20, a memory 22, an input/output (I/O) interface 24, and a bus 26. Further, computer 14 is shown in communication with an external I/O device/resource 28 and a storage system 29. In general, processor 20 executes computer program code, such as design system 30, that is stored in memory 22 and/or storage system 29. While executing computer program code (e.g., design system 30), processor 20 can read and/or write data, such as design data 50, to/from memory 22, storage system 29, and/or I/O interface 24. Bus 26 provides a communication link between each of the components in computer 14, and I/O device 28 can comprise any device that enables user 12 to interact with computer 14 (e.g., keyboard, pointing device, display, etc.).

Alternatively, user 12 can interact with another computing device (not shown) in communication with computer 14. In this case, I/O device 28 can comprise any device that enables computer 14 to communicate with one or more other computing devices over a network (e.g., network adapter, I/O port, modem, etc.). The network can comprise any combination of various types of communications links. For example, the network can comprise addressable connections that may utilize any combination of wireline and/or wireless transmission methods. In this instance, the computing devices (e.g., computer 14) may utilize conventional network connectivity, such as Token Ring, Ethernet, WiFi or other conventional communications standards. Further, the network can comprise one or more of any type of network, including the Internet, a wide area network (WAN), a local area network (LAN), a virtual private network (VPN), etc. Where communications occur via the Internet, connectivity could be provided by conventional TCP/IP sockets-based protocol, and a computing device could utilize an Internet service provider to establish connectivity to the Internet.

Computer 14 is only representative of various possible combinations of hardware and software. For example, processor 20 may comprise a single processing unit, or be distributed across one or more processing units in one or more locations, e.g., on a client and server. Similarly, memory 22 and/or storage system 29 can comprise any combination of various types of computer-readable media and/or transmission media that reside at one or more physical locations. Further, I/O interface 24 can comprise any system for exchanging information with one or more I/O devices 28. Still further, it is understood that one or more additional components (e.g., system software, math co-processor, etc.) not shown in FIG. 1 can be included in computer 14. To this extent, computer 14 can comprise any type of computing device such as a network server, a desktop computer, a laptop, a handheld device, a mobile phone, a pager, a personal data assistant, etc. However, if computer 14 comprises a handheld device or the like, it is understood that one or more I/O devices 28 (e.g., a display) and/or storage system 29 could be contained within computer 14, not externally as shown.

As discussed further below, design system 30 designs and/or evaluates design data 50 for a circuit. To this extent, design system 30 is shown including a modification system 32 for obtaining design data 50, a rule system 34 for obtaining a rule, and a violation system 36 for detecting a rule violation based on the rule and design data 50. Additionally, design system 30 is shown including an adjustment system 38 for obtaining one or more adjustments for an adjustable parameter for the rule violation, an algorithm system 40 for obtaining a calculation algorithm based on the rule violation, and a prediction system 42 that generates a prediction for each adjustment by applying the calculation algorithm. Still further, design system 30 is shown including a feedback system 44 that obtains a modification for implementation into design data 50 based on the prediction(s). Operation of each of these systems is discussed further below. However, it is understood that some of the various systems shown in FIG. 1 can be implemented independently, combined, and/or stored in memory for one or more separate computers 14 that communicate over a network. Further, it is understood that some of the systems and/or functionality may not be implemented, or additional systems and/or functionality may be included as part of system 10.

Figure 2:
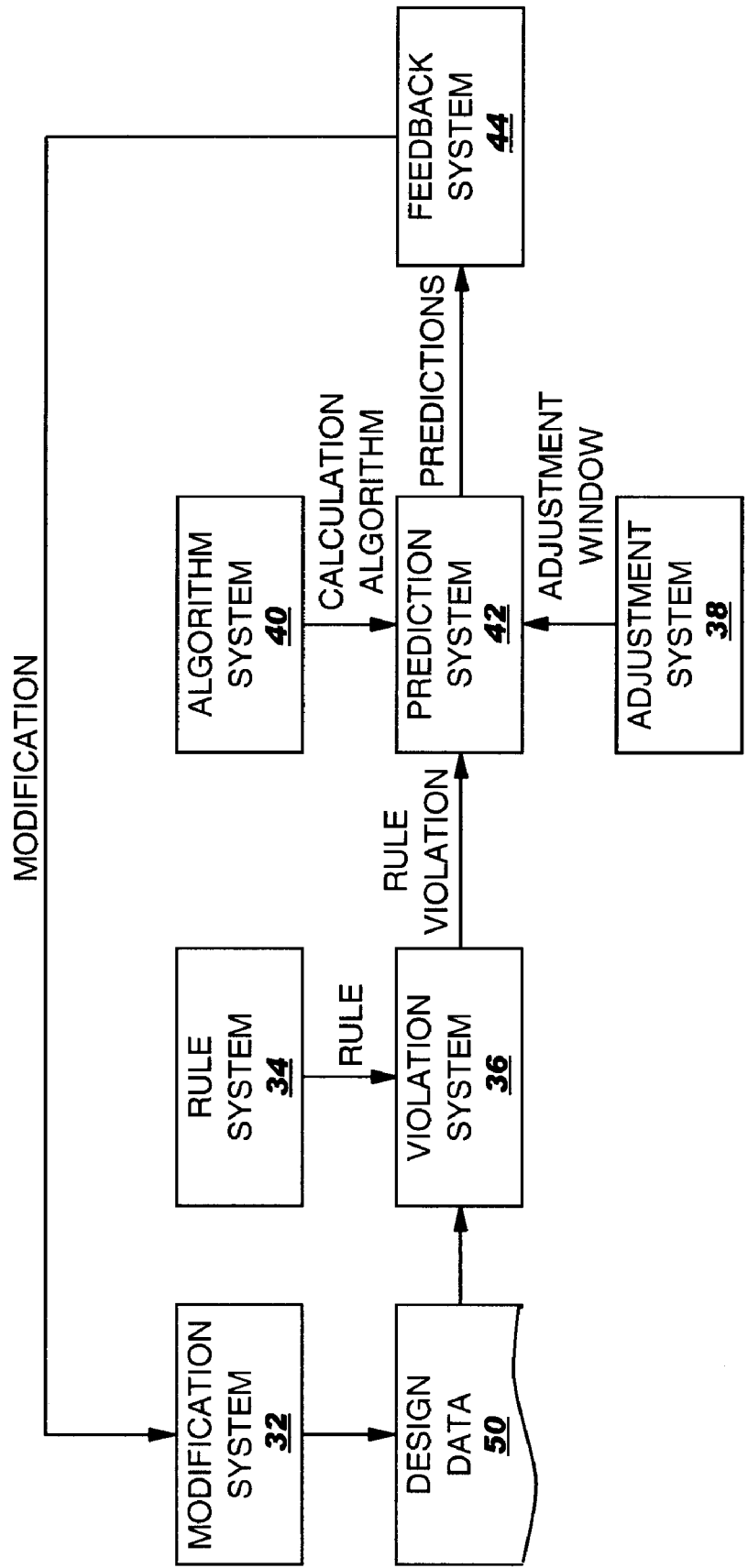
FIG. 2 shows an illustrative data flow for the various systems shown in FIG. 1.

FIG. 2 shows an illustrative data flow for the various systems shown in FIG. 1. In particular, modification system 32 obtains design data 50 for a circuit using any solution. For example, design system 30 (FIG. 1) can comprise any known circuit design tool, and modification system 32 can allow user 12 (FIG. 1) to manage (e.g., create, delete, modify, etc.) design data 50. In this case, modification system 32 can further enable user 12 to request evaluation of design data 50. To this extent, modification system 32 can enable user 12 to identify design data 50 by selecting a portion of the design data for a particular circuit for evaluation. Further, design data 50 can be communicated to modification system 32 from another computing device for evaluation. It is understood that these solutions are only illustrative of the various solutions that can be implemented by modification system 32 for obtaining design data 50.

In any event, modification system 32 provides design data 50 to violation system 36 for evaluation. Violation system 36 detects a set (one or more) of rule violations based on design data 50. In one embodiment, violation system 36 can obtain one or more rules that define the rule violation(s) from a rule system 34. Rule system 34 can manage a set of rules that are used to analyze various aspects of design data 50. Each rule can be based on a known good practice for circuit design, an internal design rule for a company, or the like. For example, rule system 34 may include a rule that limits the length of a wire on the exterior of a board to no more than two hundred mils (one mil is one-one thousandth of an inch). The wire may be configured to, for example, carry a frequency signal, such as a clock frequency.

A typical rule includes a definition of a set of acceptable values for a particular parameter. To this extent, an acceptable value for a parameter can be defined by a range of values. In this case, the minimum/maximum values for the range can be based on a typical manufacturing requirement (e.g., a minimum wire thickness), a known good practice (e.g., a maximum wire length), or the like. Further, the acceptable value(s) for a parameter may vary based on the values of one or more additional parameters. In one embodiment, the wire length rule discussed above can comprise a group of acceptable length values that vary based on wire thickness, clock frequency, wire type, etc. For example, a wire carrying a lower clock frequency may be allowed to have a longer length on the exterior of a board than a similar wire carrying a higher clock frequency.

In one embodiment, rule system 34 enables user 12 (FIG. 1) to add, delete, and/or modify one or more rules in the set of rules. To this extent, rule system 34 can enable user 12 to selectively alter the set of acceptable values for one or more parameters. For example, user 12 could alter the default acceptable length for the wire discussed above (e.g., less than or equal to two hundred mils) to higher and/or lower values. Further, as manufacturing techniques change, the corresponding acceptable values for a particular parameter may be changed. For example, user 12 could alter a minimum wire thickness that is allowed in a circuit. To this extent, rule system 34 could receive modified acceptable values and/or rules periodically from an external system or the like that comprises a set of acceptable values for a particular entity (e.g., business, certification entity, etc.). Still further, rule system 34 can enable user 12 to selectively choose one or more of the set of rules for application to design data 50. In this manner, user 12 can perform a limited evaluation of design data 50 seeking to only detect a particular subset of possible rule violations.

In any event, violation system 36 applies the rule(s) to design data 50 to detect a rule violation. The rule violation comprises some or all of design data 50 that violates one or more of the rule(s). To this extent, the rule violation can include various physical dimensional data and/or electrical characteristic data of design data 50. Subsequently, violation system 36 provides the rule violation to prediction system 42 for further evaluation. Prediction system 42 generates a prediction based on an adjustment to an adjustable parameter for the rule violation. The prediction comprises an estimate of the relative improvement/degradation that will be realized should the adjustment to the adjustable parameter be implemented in design data 50. To this extent, the prediction can comprise an adjustment and a corresponding predicted impact for the adjustment. In one embodiment, each predicted impact is expressed as a difference in decibel microvolts of the electric field intensity that will be picked up at a receiver a particular distance away from the circuit.

Prediction system 42 can receive the adjustment from adjustment system 38. For example, adjustment system 38 can display an interface to user 12 (FIG. 1), which enables user 12 to identify the adjustable parameter and the adjustment for the rule violation. To this extent, adjustment system 38 can display the portion of design data 50 that corresponds to the rule violation. Further, the particular circuit item(s) can be highlighted, and the values of the various parameters can be displayed to assist user 12 in determining the adjustable parameter and/or desired adjustment. Subsequently, user 12 can identify one or more of the various parameters as the adjustable parameter and the corresponding adjustment(s).

In one embodiment, adjustment system 38 obtains an adjustment window for the adjustable parameter. For example, user 12 (FIG. 1) can specify a minimum and maximum value that define the adjustment window (e.g., range) within which user 12 wants to consider altering the adjustable parameter. Further, adjustment system 38 can analyze design data 50 to determine a minimum adjustment for the adjustment window. For example, when a wire connects two circuit items that cannot be placed closer than one hundred mils, then adjustment system 38 can limit user 12 to an adjustment window having a minimum adjustment of at least one hundred mils. In any event, adjustment system 38 can provide the adjustment window to prediction system 42.

Prediction system 42 can generate a plurality of predictions based on the adjustment window. To this extent, prediction system 42 can generate a set of adjustments for the adjustable parameter based on the adjustment window. For example, prediction system 42 can automatically determine a uniform step size between adjustments and generate each adjustment by repeatedly adding the step size to a previous adjustment. The step size can be selected to provide a set number of adjustments (e.g., ten) for the adjustment window, to provide a certain resolution (e.g., every five mils) throughout the adjustment window, or the like.

For each adjustment in the set of adjustments, prediction system 42 can determine a predicted impact. In one embodiment, prediction system 42 applies a calculation algorithm to the rule violation and each adjustment. To this extent, prediction system 42 can provide the rule violation to algorithm system 40, which can obtain the calculation algorithm based on the rule violation and provide the calculation algorithm to prediction system 42. In general, algorithm system 40 can manage a set of calculation algorithms. Each calculation algorithm can comprise an equation that approximates an anticipated behavior of the circuit. In this case, the rule violation and/or design data 50 can be provided to the calculation algorithm to obtain a baseline for the expected behavior of the circuit (e.g., a baseline number of decibel microvolts). Subsequently, the adjustment can be performed on the rule violation (design data 50), and an adjusted expected behavior of the circuit can be calculated. The predicted impact is then the difference between the baseline expected behavior and the adjusted expected behavior.

To this extent, algorithm system 40 can generate each calculation algorithm based on a set of results of one or more full-wave simulations and/or one or more actual measurements of the behavior of a sample circuit. In this case, the sample circuit can comprise a similar set of parameters (e.g., wire having a non-zero length on the exterior of a board) as those of design data 50. In one embodiment, algorithm system 40 can obtain the set of results from a full-wave simulation system or the like, as are known in the art.

Alternatively, algorithm system 40 can obtain sample design data for a sample circuit that includes a similar set of parameters (e.g., wire having a non-zero length on the exterior of a board) as those of design data 50. For the sample design data, algorithm system 40 can define a sample adjustment window for an adjustable parameter (e.g., wire length), and define a plurality of adjustments within the sample adjustment window. Subsequently, algorithm system 40 can perform a full-wave simulation on the sample design data, adjust the sample design data for each adjustment, and repeat the full-wave simulation for each adjustment. The results of each of the full-wave simulations can then be used as the set of results to generate the calculation algorithm.

In addition to, or alternative to, the results of one or more full-wave simulations, algorithm system 40 can generate a calculation algorithm based on an actual measurement for a sample circuit having a similar set of parameters as those of design data 50. For example, user 12 (FIG. 1) can build and test the sample circuit. While the sample circuit is being tested, user 12 can obtain an actual measurement of one or more attributes of the sample circuit. The actual measurement(s) can be provided to algorithm system 40 for use in generating the calculation algorithm. Similarly, actual measurements for additional sample circuits having one or more adjustments (e.g., varying wire lengths on exterior of a board) can be provided to algorithm system 40 as a set of actual measurements for use in generating the calculation algorithm. In any event, algorithm system 40 can generate calculation algorithm based on an analysis of the set of results/actual measurements using any known solution, such as a curve-fitting algorithm or the like. As a result, the calculation algorithm will require significantly less computing resources than a full-wave simulation, thereby enabling a larger amount of design data to be analyzed in a shorter amount of time.

Figure 3:
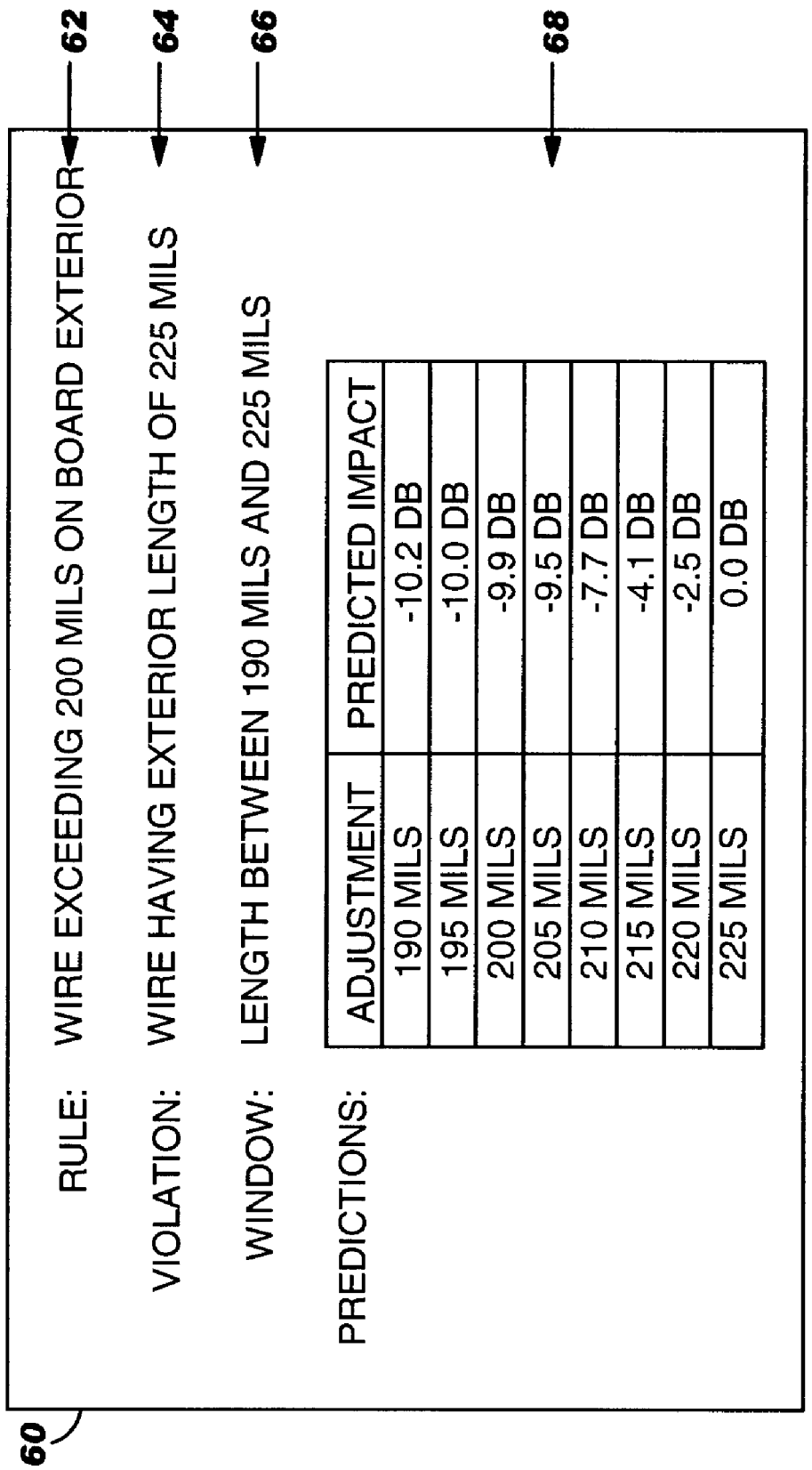
FIG. 3 shows an illustrative display area for displaying a plurality of predictions to a user.

Regardless, prediction system 42 can apply the calculation algorithm to the rule violation (design data 50) to generate each prediction. To this extent, design data 50 can be modified based on each adjustment in the adjustment window, and calculation algorithm can subsequently be applied to each modified version of design data 50. Subsequently, the plurality of predictions can be provided to feedback system 44. Feedback system 44 can display the plurality of predictions to user 12 (FIG. 1). For example, FIG. 3 shows an illustrative display area 60 that can be generated by feedback system 44 (FIG. 2) for display to user 12 (FIG. 1). In this case, display area 60 includes a description 62 of the rule used to identify the rule violation, a description 64 of the rule violation, the adjustment window 66 that was specified for evaluation, and the plurality of predictions 68. It should be recognized that while the illustrative display is shown in a tabular form, that other formats such as a graphical representation (e.g., in a graphical user interface) may also be used.

As a result of the above methodology, user 12 (FIG. 1) can readily review all aspects of the evaluation in order to make an informed decision as to any desired modifications. In particular, user 12 can assess the value of various adjustments and the relative harm for not doing so. For example, user 12 may be able to reduce the length of the wire to two hundred five mils relatively easily, but cannot reduce the length below two hundred mils without a lot of difficulty. By reviewing display area 60, user 12 can readily determine what the estimated relative risk is for only partially correcting the violation and make his/her decision based on the relative risk.

Returning to FIG. 2, feedback system 44 can obtain a modification for implementation into design data 50. For example, user 12 (FIG. 1) can use display area 60 (FIG. 3) and one or more I/O devices 28 (FIG. 1) to select one of the plurality of predictions 68 (FIG. 3). In response, feedback system 44 can provide the modification to modification system 32. Modification system 32 can then display the modification to user 12 the next time that design data 50 is accessed for editing. Additionally, feedback system 44 can communicate the modification directly to user 12 via an electronic message or the like. Still further, modification system 32 can automatically implement the modification into design data 50. For example, modification system 32 can comprise a script or the like that automatically re-routes a wire in design data 50 to make the modification. Subsequently, user 12 can review the modified design data 50 to ensure that the modification was incorporated correctly. It is understood that user 12 can also make one or more modifications to the evaluation. For example, user 12 could modify the adjustment window, and feedback system 44 could provide the modified adjustment window to prediction system, which in turn generates a new set of predictions.

Figure 4:
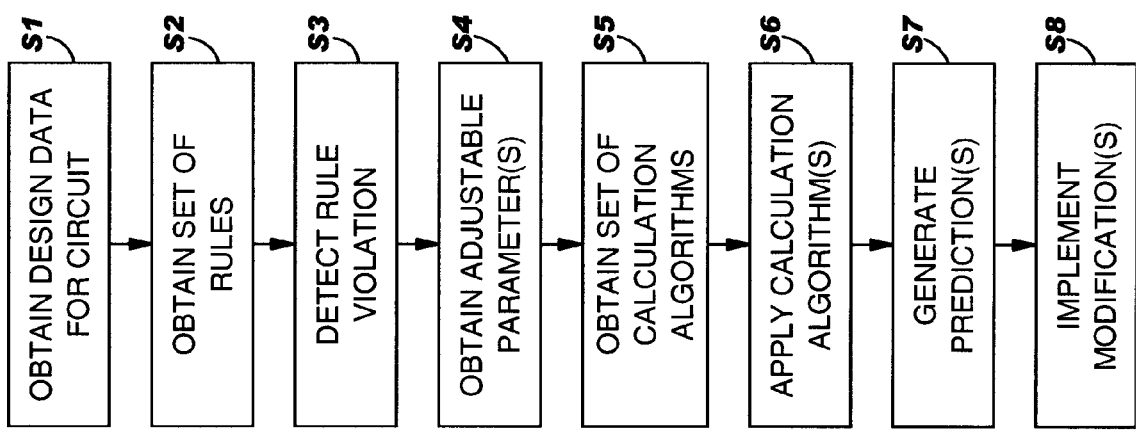
FIG. 4 shows illustrative method steps according to one embodiment of the invention.

In one embodiment, the invention comprises a series of method steps that can be implemented by some or all of the various systems described herein. FIG. 4 shows illustrative method steps according to one embodiment of the invention. In particular, in step S1, design data for a circuit is obtained, and in step S2, a set of rules for evaluating the design data are obtained. In step S3, a rule violation is detected in the design data based on one or more of the set of rules. In step S4, an adjustment window for an adjustable parameter is obtained for the rule violation, and in step S5, a set of calculation algorithms can be obtained. In step S6, one or more of the calculation algorithms can be applied to the design data, and in step S7, a plurality of predictions are generated. In step S8, one or more modifications can be implemented based on the plurality of predictions. It is understood that the order of the steps is only illustrative. To this extent, one or more steps can be performed in parallel, in a different order, at a remote time, etc. Further, one or more of the steps may not be performed in various embodiments of the invention. For example, step S8 may not be performed when no modification is desired.

Returning to FIG. 1, various additions and/or alterations can be made to the described embodiments of the invention. For example, user 12 can specify multiple adjustable parameters for a particular rule violation, and prediction system 42 can generate predictions for various combinations of adjustments to one or more of the adjustable parameters. Additionally, multiple rule violations that share a common portion of design data 50 can be evaluated together by prediction system 42.

In any event, it should be appreciated that the teachings of the present invention could be offered as a business method on a subscription or fee basis. For example, design system 30 and/or computer 14 could be created, maintained, supported and/or deployed by a service provider that offers the functions described herein for customers. That is, a service provider could offer to design and/or evaluate a circuit as described above. It is understood that the present invention can be realized in hardware, software, a propagated signal, or any combination thereof. Any kind of computer/server system(s)—or other apparatus adapted for carrying out the methods described herein—is suited. A typical combination of hardware and software could be a general purpose computer system with a computer program that, when loaded and executed, carries out the respective methods described herein. Alternatively, a specific use computer, containing specialized hardware for carrying out one or more of the functional tasks of the invention (e.g., design system 30), could be utilized.

The present invention also can be embedded in a computer program product or a propagated signal, which comprises all the respective features enabling the implementation of the methods described herein, and which when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of evaluating a circuit, the method comprising:
   obtaining design data for the circuit;
   detecting a rule violation based on the design data, the rule violation impacting an electric field intensity emitted by the circuit;
   obtaining an adjustment window for an adjustable parameter for the rule violation; and
   generating a plurality of predictions based on the adjustment window, each prediction including a predicted impact of an adjustment to the adjustable parameter on the electric field intensity emitted by the circuit.

2. The method of claim 1, wherein the generating step includes:
   obtaining a calculation algorithm based on the rule violation;
   generating a plurality of adjustments for the adjustable parameter based on the adjustment window; and
   determining a predicted impact for each adjustment in the plurality of adjustments by applying the calculation algorithm, wherein each of the plurality of predictions comprises an adjustment and a corresponding predicted impact.

3. The method of claim 2, wherein the obtaining a calculation algorithm step includes:
   obtaining a set of results for a set of full-wave simulations on sample design data for a sample circuit, wherein the sample design data includes a similar set of parameters as the design data; and
   generating the calculation algorithm based on the set of results.

4. The method of claim 3, wherein the obtaining a set of results includes:
   obtaining the sample design data;
   performing a full-wave simulation on the sample design data;
   defining a sample adjustment window for the adjustable parameter;
   adjusting the sample design data for each of a plurality of adjustments in the sample adjustment window; and
   repeating the performing step for each adjusted sample design data, wherein the set of results includes the result of each of the full-wave simulations.

5. The method of claim 2, wherein the obtaining a calculation algorithm step includes:
   obtaining an actual measurement for a sample circuit having a similar set of parameters as the design data; and
   generating the calculation algorithm based on the actual measurement.

6. The method of claim 1, further comprising obtaining a modification for implementation into the design data based on one of the plurality of predictions.

7. The method of claim 6, further comprising automatically implementing the modification into the design data.

8. The method of claim 1, wherein the detecting step includes:
   obtaining a rule that defines the rule violation; and
   applying the rule to the design data.

9. The method of claim 8, wherein the detecting step further includes obtaining a set of acceptable values for the rule, wherein the set of acceptable values further define the rule violation.

10. The method of claim 1, further comprising identifying one of a plurality of parameters as the adjustable parameter.

11. The method of claim 1, wherein the obtaining an adjustment window step includes automatically analyzing the design data to determine a minimum adjustment for the adjustment window.

12. A system for evaluating a circuit, the system comprising:
   a modification system for obtaining design data for the circuit;
   a violation system for detecting a rule violation based on the design data, the rule violation violating a rule for reducing an electric field intensity emitted by the circuit;

an adjustment system for obtaining an adjustment window for an adjustable parameter for the rule violation; and a prediction system for generating a plurality of predictions based on the adjustment window, each prediction including a predicted impact of an adjustment to the adjustable parameter on the electric field intensity emitted by the circuit.

13. The system of claim 12, further comprising a rule system for obtaining a rule that defines the rule violation, wherein the violation system applies the rule to the design data.

14. The system of claim 12, further comprising an algorithm system for obtaining a calculation algorithm based on the rule violation, wherein the prediction system generates the plurality of predictions by applying the calculation algorithm.

15. The system of claim 12, wherein each of the plurality of predictions includes:

an adjustment to the adjustable parameter; and a predicted impact for the adjustment.

16. The system of claim 12, further comprising a feedback system for obtaining a modification for implementation into the design data based on one of the plurality of predictions.

17. The system of claim 16, wherein the modification system automatically implements the modification into the design data.

18. A program product stored on a computer-readable medium, which when executed, evaluates a circuit, the program product comprising:

program code for obtaining design data for the circuit;

program code for detecting a rule violation based on the design data, the rule violation impacting an electric field intensity emitted by the circuit;

program code for obtaining an adjustment window for an adjustable parameter for the rule violation; and program code for generating a plurality of predictions based on the adjustment window, each prediction including a predicted impact of an adjustment to the adjustable parameter on the electric field intensity emitted by the circuit.

19. The program product of claim 18, wherein the program code for generating includes:

program code for obtaining a calculation algorithm based on the rule violation;

program code for generating a plurality of adjustments for the adjustable parameter based on the adjustment window; and program code for determining a predicted impact for each adjustment in the plurality of adjustments by applying the calculation algorithm, wherein each of the plurality of predictions comprises an adjustment and a corresponding predicted impact.

20. The program product of claim 18, farther comprising program code for obtaining a modification for implementation into the design data based on one of the plurality of predictions.

21. The program product of claim 20, further comprising program code for automatically implementing the modification into the design data.

22. The program product of claim 18, wherein the program code for detecting includes:

program code for obtaining a rule that defines the rule violation; and program code for applying the rule to the design data.

23. The program product of claim 18, further comprising program code for identifying one of a plurality of parameters as the adjustable parameter.

24. The program product of claim 18, wherein the program code for obtaining an adjustment window includes program code for analyzing the design data to determine a minimum adjustment for the adjustment window.

25. A circuit design tool comprising:

a modification system for managing design data for the circuit;

a violation system for detecting a rule violation based on the design data, the rule violation impacting an electric field intensity emitted by the circuit;

a parameter system for obtaining an adjustment window for an adjustable parameter for the rule violation; and a predication system for generating a plurality of predictions based on the adjustment window, each prediction including a predicted impact of an adjustment to the adjustable parameter on the electric field intensity emitted by the circuit.

26. The circuit design tool of claim 25, further comprising a rule system for obtaining a rule that defines the rule violation, wherein the violation system applies the rule to the design data.

27. The circuit design tool of claim 25, further comprising an algorithm system for obtaining a calculation algorithm based on the rule violation, wherein the prediction system generates the plurality of predictions by applying the calculation algorithm to the rule violation.

28. The circuit design tool of claim 25, further comprising a feedback system for obtaining a modification for implementation into the design data based on one of the plurality of predictions.

29. The circuit design tool of claim 28, wherein the modification system automatically implements the selected adjustment into the design data.

30. The circuit design tool of claim 25, wherein a user uses the modification system to modify the design data.

* * * * *